US010222009B2

(12) United States Patent
Woisetschlaeger et al.

(10) Patent No.: US 10,222,009 B2
(45) Date of Patent: Mar. 5, 2019

(54) ILLUMINATION APPARATUS

(71) Applicant: OSRAM GmbH, Munich (DE)

(72) Inventors: Oliver Woisetschlaeger, Sontheim (DE); Frank Buchmann, Jena (DE)

(73) Assignee: OSRAM GmbH, Munich (DE)

( * ) Notice: Subject to any disclaimer, the term of this patent is extended or adjusted under 35 U.S.C. 154(b) by 0 days.

(21) Appl. No.: 15/666,627

(22) Filed: Aug. 2, 2017

(65) Prior Publication Data

US 2018/0038558 A1 Feb. 8, 2018

(30) Foreign Application Priority Data

Aug. 5, 2016 (DE) .................. 10 2016 214 513

(51) Int. Cl.
*F21K 9/64* (2016.01)
*F21K 9/68* (2016.01)
(Continued)

(52) U.S. Cl.
CPC .................. *F21K 9/64* (2016.08); *F21K 9/68* (2016.08); *F21K 9/69* (2016.08); *F21S 41/14* (2018.01); *F21S 41/16* (2018.01); *F21S 41/20* (2018.01); *F21S 41/30* (2018.01); *F21S 41/675* (2018.01); *F21V 5/043* (2013.01); *G02B 26/105* (2013.01);
(Continued)

(58) Field of Classification Search
CPC ......... F21S 41/675; F21S 41/16; F21V 5/043; G02B 27/0966; G02B 26/105
See application file for complete search history.

(56) References Cited

U.S. PATENT DOCUMENTS 3,396,344 A 8/1968 Broom
6,768,593 B1 7/2004 Jutamulia
(Continued)

FOREIGN PATENT DOCUMENTS

DE 102014204613 B4 12/2015
EP 2963476 A1 1/2016
(Continued)

OTHER PUBLICATIONS

European Search Report based on application No. 17 17 8070.3 (7 pages) dated Dec. 22, 2017 (Reference Purpose Only).
(Continued)

*Primary Examiner* — William N Harris
(74) *Attorney, Agent, or Firm* — Viering, Jentschura & Partner MBB

(57) ABSTRACT

An illumination apparatus includes a semiconductor laser device to generate a plurality of laser beams, a light wavelength conversion element configured to convert at least a portion of the light of the laser beams into light having a different wavelength, and an optical unit configured to direct the laser beams onto a surface of the light wavelength conversion element. The optical unit includes a mirror element able to be panned about an axis and is configured to guide the laser beams over at least one surface section of the surface of the at least one light wavelength conversion element. The optical unit includes a structure configured to adjust a divergence or expansion of the laser beams along at least one of a slow axis or a fast axis of the laser beams on the surface section of the surface of the at least one light wavelength conversion element.

15 Claims, 5 Drawing Sheets

(51) Int. Cl.
*F21K 9/69* (2016.01)
*F21V 5/04* (2006.01)
*H01S 5/00* (2006.01)
*F21S 41/14* (2018.01)
*F21S 41/16* (2018.01)
*F21S 41/20* (2018.01)
*F21S 41/30* (2018.01)
*G02B 26/10* (2006.01)
*G02B 27/09* (2006.01)
*F21S 41/675* (2018.01)
*F21Y 115/30* (2016.01)

(52) U.S. Cl.
CPC ....... *G02B 27/0966* (2013.01); *F21Y 2115/30* (2016.08); *H01S 5/005* (2013.01)

(56) References Cited

U.S. PATENT DOCUMENTS

| | | | | |
|---|---|---|---|---|
| 9,534,756 | B2* | 1/2017 | Takahira | F21V 14/00 |
| 2010/0328632 | A1* | 12/2010 | Kurosaki | G03B 21/204 |
| | | | | 353/98 |
| 2011/0148280 | A1* | 6/2011 | Kishimoto | F21S 41/16 |
| | | | | 313/483 |
| 2011/0280039 | A1* | 11/2011 | Kishimoto | B60Q 1/0011 |
| | | | | 362/554 |
| 2013/0258689 | A1 | 10/2013 | Takahira et al. | |
| 2015/0369437 | A1 | 12/2015 | Reinprecht et al. | |
| 2017/0284622 | A1* | 10/2017 | Rehn | F21V 9/30 |
| 2017/0305330 | A1* | 10/2017 | Park | F21V 7/05 |
| 2017/0356618 | A1* | 12/2017 | Park | F21V 7/05 |
| 2018/0156409 | A1* | 6/2018 | Schwaiger | H01S 5/005 |

FOREIGN PATENT DOCUMENTS

| | | |
|---|---|---|
| WO | 2014121315 A1 | 8/2014 |
| WO | 2017008942 A1 | 1/2017 |

OTHER PUBLICATIONS

German Search Report based on application No. 10 2016 214 513.4 (8 pages) dated Apr. 6, 2017 (Reference Purpose Only).

Cao, Zhaolou; Wang, Keyi, Wu, Qinglin: Aspherical anamorphic lens for shaping laser diode beam. In: Optics Communications, vol. 305, Sep. 15, 2013, pp. 53-56.

Revermann, Markus; Timmermann; Andre; Meinschien, Jens; Bruns, Peter; Zediker, Mark S: Efficient high-brightness diode laser modules offer new industrial applications. In: High-Power Diode Laser Technology and Applications V, vol. 6456(1), Monday Jan. 22, 2007, pp. 64560Q-1-64560Q-7.

\* cited by examiner

ILLUMINATION APPARATUS

CROSS-REFERENCE TO RELATED APPLICATION

This application claims priority to German Patent Application Ser. No. 10 2016 214 513.4, which was filed Aug. 5, 2016, and is incorporated herein by reference in its entirety.

TECHNICAL FIELD

Various embodiments relate generally to an illumination device having a semiconductor laser device that is configured to generate a plurality of laser beams, and having at least one light wavelength conversion element that is configured to convert a portion of the light of the laser beams into light having a different wavelength, with the result that the at least one light wavelength conversion element emits light that is a mixture of non-wavelength-converted laser light and wavelength-converted light. The semiconductor laser device and the at least one light wavelength conversion element may be tuned with respect to each other such that the mixture of non-wavelength-converted laser light and wavelength-converted light produces white light. The illumination device serves, for example, as a light source for a motor vehicle headlight.

BACKGROUND

In illumination devices that are equipped with a semiconductor laser device, the laser beams generated by the semiconductor laser device can have a direction-dependent expansion or divergence, which causes problems when generating or imaging a desired light distribution. The direction-dependent expansion or divergence of a laser beam is captured by way of the terms slow axis and fast axis. In a plane perpendicular to the propagation direction of the laser beam, the term slow axis designates the direction of minimum divergence of the laser beam, while the term fast axis designates the direction of maximum divergence of the laser beam. The shape and size of a light spot or laser spot that is generated by a laser beam on the surface of a screen or a light wavelength conversion element is therefore dependent on the original profile of the laser beam immediately after it leaves the semiconductor laser device and on the length of the distance traveled by the laser beam between the semiconductor laser device and the screen or a light wavelength conversion device.

SUMMARY

An illumination apparatus includes a semiconductor laser device to generate a plurality of laser beams, a light wavelength conversion element configured to convert at least a portion of the light of the laser beams into light having a different wavelength, and an optical unit configured to direct the laser beams onto a surface of the light wavelength conversion element. The optical unit includes a mirror element able to be panned about an axis and is configured to guide the laser beams over at least one surface section of the surface of the at least one light wavelength conversion element. The optical unit includes a structure configured to adjust a divergence or expansion of the laser beams along at least one of a slow axis or a fast axis of the laser beams on the surface section of the surface of the at least one light wavelength conversion element.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

Figure 1:
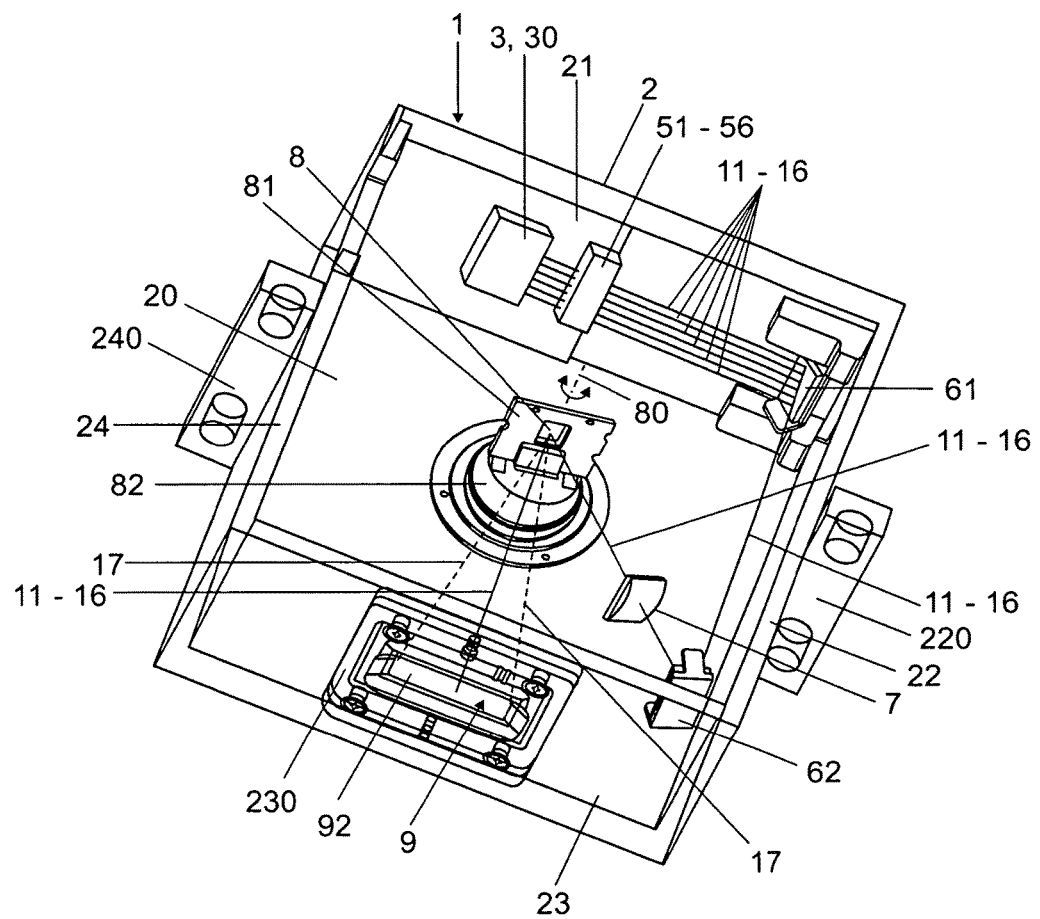
FIG. 1 shows an illumination device according to various embodiments in isometric, schematic illustration.

The following detailed description refers to the accompanying drawings that show, by way of illustration, specific details and embodiments in which the invention may be practiced.

Various embodiments provide an illumination device having a semiconductor laser device generating a plurality of laser beams and having at least one light wavelength conversion element, which illumination device permits improved adjustment and/or alignment and/or shaping of the laser beams on a surface of the at least one light wavelength conversion element.

The illumination device according to various embodiments has a semiconductor laser device that is configured for generating a plurality of laser beams, and at least one light wavelength conversion element that is configured to convert at least a portion of laser light into light having a different wavelength, and an optical unit that is configured to direct the laser beams onto a surface of the at least one light wavelength conversion element. The optical unit has at least one mirror element that is able to be panned about at least one axis and is configured to guide the laser beams over at least one surface section of the surface of the at least one light wavelength conversion element. In addition, the optical unit includes a structure for adjusting a divergence or expansion of the laser beams along a slow axis or a fast axis, or a structure for adjusting a divergence or expansion of the laser beams along a slow axis and a fast axis of the laser beams on the previously mentioned surface section of the surface of the at least one light wavelength conversion element.

As a result, precise alignment of the laser beams relative to one another on the surface of the at least one light wavelength conversion element can be ensured. In various embodiments, the laser spot size and the laser spot shape and also the arrangement of each laser beam on the surface section of the surface of the at least one light wavelength conversion element can thus be adjusted or set.

The above-mentioned structures of the optical unit of the illumination device according to various embodiments may include at least one first cylindrical lens for focusing the laser beams along their slow axis. The at least one first cylindrical lens permits adjustment of the laser spots of the laser beams on the surface of the at least one light wavelength conversion element in the direction of their slow axis.

The laser beams may be arranged such that their light propagation directions, their slow axis and their fast axis extend parallel with respect to one another. As a result, a common first cylindrical lens suffices for focusing or adjusting the slow axis of all laser beams on the surface of the at least one light wavelength conversion element.

The at least one first cylindrical lens may be configured in the form of a plano-convex cylindrical lens, the convex curvature of which extends in the direction of the slow axis of the laser beams.

The optical unit and the semiconductor laser device of the illumination device according to various embodiments may be configured such that the laser beams are guided in each case parallel with respect to a scanning direction over a surface section of the surface of the at least one light wavelength conversion element. As a result, a surface section or the entire surface of the at least one light wavelength conversion element can be row-scanned or column-scanned with laser light, and a desired light distribution can be generated. In various embodiments, the laser beams can be guided simultaneously over the surface of the at least one light wavelength conversion element by way of the at least one mirror element, and as a result a plurality of rows or columns of the surface section can be simultaneously scanned with laser light. In addition, a light distribution on the surface of the at least one light wavelength conversion element can be varied by way of temporarily switching off or dimming or increasing the operating current for individual or all laser light sources of the semiconductor laser device as the surface of the at least one light wavelength conversion element is row-scanned or column-scanned.

The optical unit and the semiconductor laser device of the illumination device according to various embodiments may be configured such that the slow axis of the laser beams is arranged on the surface section of the at least one light wavelength conversion element in each case perpendicular to the scanning direction. As a result, exact adjustment of the laser spot size perpendicular to the scanning direction and exact adjustment of the distance between the laser spots of the laser beams on the surface of the at least one light wavelength conversion element and e.g. also minimization of the distance between the laser spots perpendicular to the scanning direction are possible.

The abovementioned structures for adjusting a divergence or expansion of the laser beams along a slow axis or/and a fast axis of the laser beams preferably include at least one aspherical optical element for focusing the laser beams along a fast axis of the laser beams. As a result, focusing of the laser beams along the fast axis of the laser beams on the surface of the at least one light wavelength conversion element is made possible. The at least one aspherical optical element has the further advantage that it additionally also has a focusing effect on the laser beams along their slow axis. For each laser beam, e.g. a separate aspherical element, for example an aspherical optical lens, is provided in order to be able to separately adjust the expansion of each laser beam along its fast axis on a surface section of the surface of the at least one light wavelength conversion element. It is e.g. also possible thereby to match the laser spot sizes of the laser beams on the surface of the at least one light wavelength conversion element to one another despite different path lengths and different divergence or expansion of the laser beams.

The optical unit and the semiconductor laser device of the illumination device according to various embodiments may be configured such that the fast axis of the laser beams is arranged on the surface section of the at least one light wavelength conversion element in each case parallel with respect to the scanning direction.

The at least one aspherical optical element is arranged in the beam path of the laser beams e.g. upstream of the at least one first cylindrical lens and e.g. immediately downstream of the semiconductor laser device in order to reduce the divergence of the laser beams before they are incident on other components of the optical unit of the illumination device according to various embodiments, e.g. before they are incident on the at least one mirror element which is able to be panned about at least one axis.

The abovementioned structures for adjusting a divergence or expansion of the laser beams along a slow axis or/and a fast axis of the laser beams may include at least one second cylindrical lens which is arranged for the purposes of expanding at least one laser beam along the slow axis in the beam path of at least one laser beam. The at least one second cylindrical lens may have the effect that the divergence of the at least one laser beam and thus the laser spot dimension in the direction of its slow axis can be adjusted on a surface section of the surface of the at least one light wavelength conversion element independently of the other laser beams. A second cylindrical lens may be provided for each laser beam in order to be able to adjust the divergence or expansion of each individual laser beam along its slow axis independently of the other laser beams on a surface section of the surface of the at least one light wavelength conversion element. For example, the second cylindrical lenses permit matching of the dimensions of the laser spots created by the laser beams on the surface of the at least one light wavelength conversion element in the direction of the slow axis. However, it is alternatively also possible by way of the second cylindrical lens to generate laser spots having different dimensions or mutual spacings in the direction of the slow axis.

The at least one second cylindrical lens may be configured as a plano-concave cylindrical lens in order to achieve expansion of the laser beams along their slow axis. The concave curvature of the at least one plano-concave cylindrical lens may extend in the direction of the slow axis of the laser beams, with the result that the effect of the plano-concave cylindrical lenses is limited to the divergence or expansion of the laser beams along the slow axis, and e,g, does not extend to the divergence or expansion of the laser beams along the fast axis.

By way of example, the combination of the at least one aspherical optical element with the at least one first, plano-convex cylindrical lens and the at least one second, plano-concave cylindrical lens, is provided.

Due to the interaction of the at least one aspherical optical element with the at least one first and second cylindrical lenses, individual adjustment of the divergence of the laser beams in the direction of their slow axis and their fast axis is made possible, with the result that the laser spots created by the laser beams on a surface section of the surface of the at least one light wavelength conversion element in each case have the desired dimensions along the slow axis and along the fast axis.

The illumination device according to various embodiments may be configured such that the propagation direction and the slow axis and the fast axis of the laser beams emitted by its semiconductor laser device are in each case aligned parallel with respect to one another. As a consequence, it is possible using the laser beams to implement, with little outlay, simultaneous row-scanning or column-scanning of a surface section of the surface of the at least one light wavelength conversion element.

The semiconductor laser device of the illumination device according to various embodiments may have a plurality of laser diodes which are each configured to generate blue laser light during operation, and the at least one light wavelength conversion element of the illumination device according to various embodiments may be configured to convert a portion of blue laser light into light having a different wavelength, with the result that the at least one light wavelength conversion element emits white light, which is a mixture of non-wavelength-converted blue laser light and light that has been wavelength-converted at the at least one light wavelength conversion element. As a result, a light source for white light having very high luminance and light intensity can be provided, which may be for projection applications, such as for example as a light source for a motor vehicle headlight. Such illumination devices can also be referred to as laser activated remote phosphor (LARP) illumination devices.

The illumination device according to various embodiments may be configured to be a part of a motor vehicle headlight or as a motor vehicle headlight. The illumination device according to various embodiments may be used to generate light distributions for a motor vehicle front headlight. Generally, a motor vehicle can be an aircraft or a water-borne vehicle or a land-bound vehicle. The land-bound vehicle can be a motor vehicle or a rail vehicle or a bicycle. In various embodiments, the use of the vehicle headlight in a truck or passenger car or motorcycle is provided.

Further applications are in projection lamps and/or lamps for stage and effect illumination, external illumination, room illumination, or ambient illumination.

Figure 2:
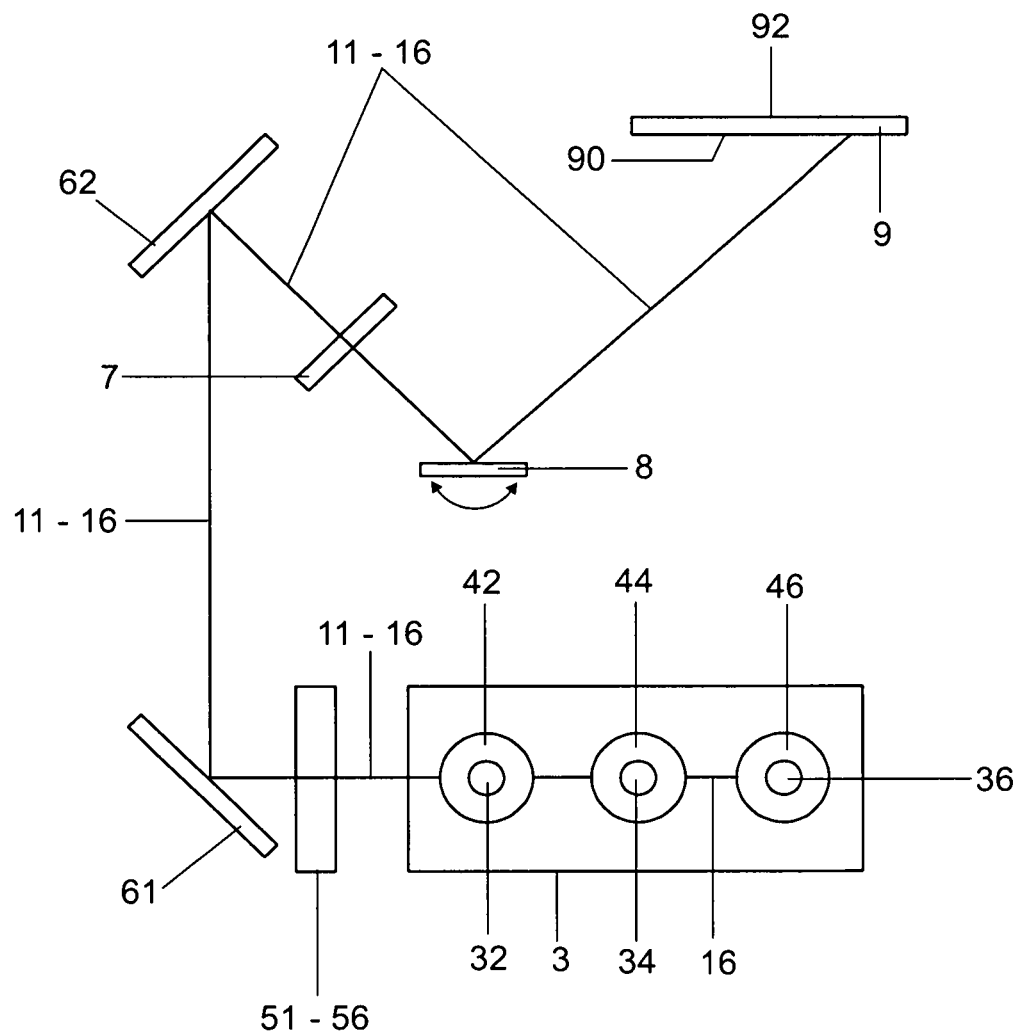
FIG. 2 shows a top view of essential components of the illumination device illustrated in FIG. 1.

FIG. 1 and FIG. 2 schematically illustrate an illumination device 1 according to various embodiments. This illumination device 1 is configured as a part of a motor vehicle headlight which serves for generating low beam or high beam light or for generating both of these illumination functions.

Figure 3:
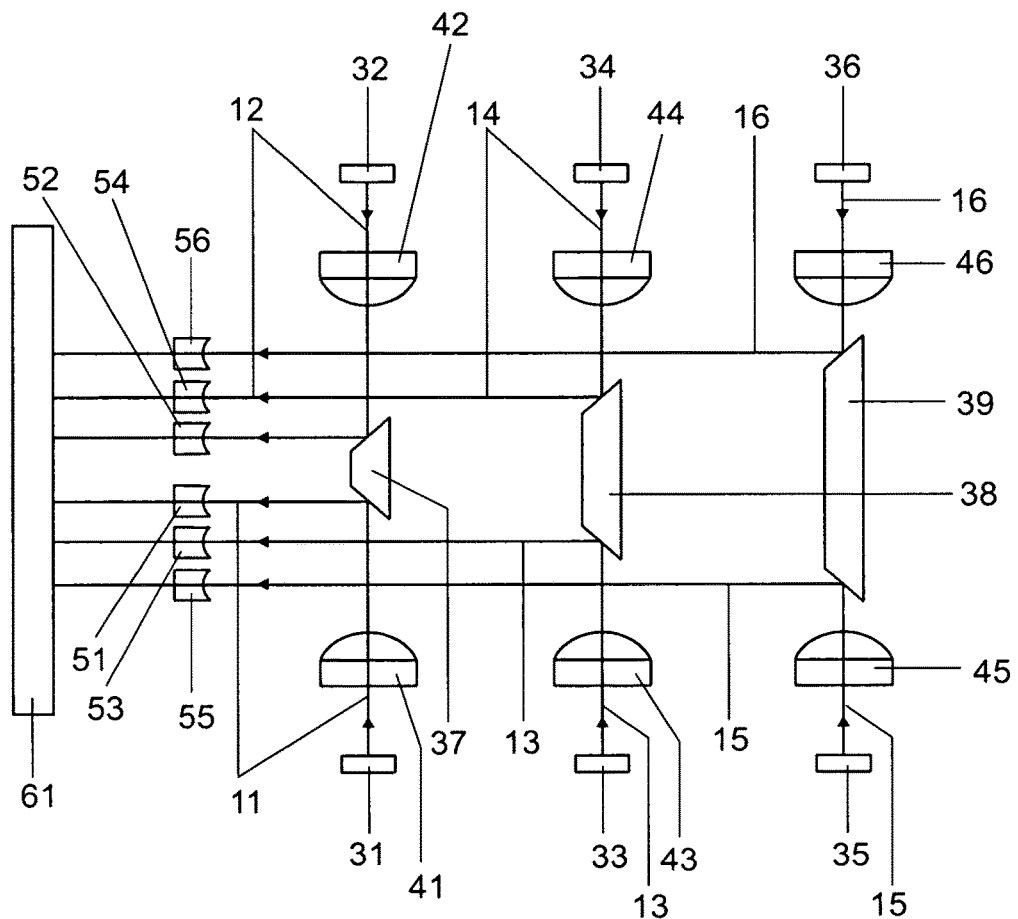
FIG. 3 shows a side view of the semiconductor laser device, the aspherical lenses and the plano-concave cylindrical lenses and also of the first deflection mirror of the illumination device illustrated in FIG. 1 and FIG. 2 in schematic illustration.
Figure 4:
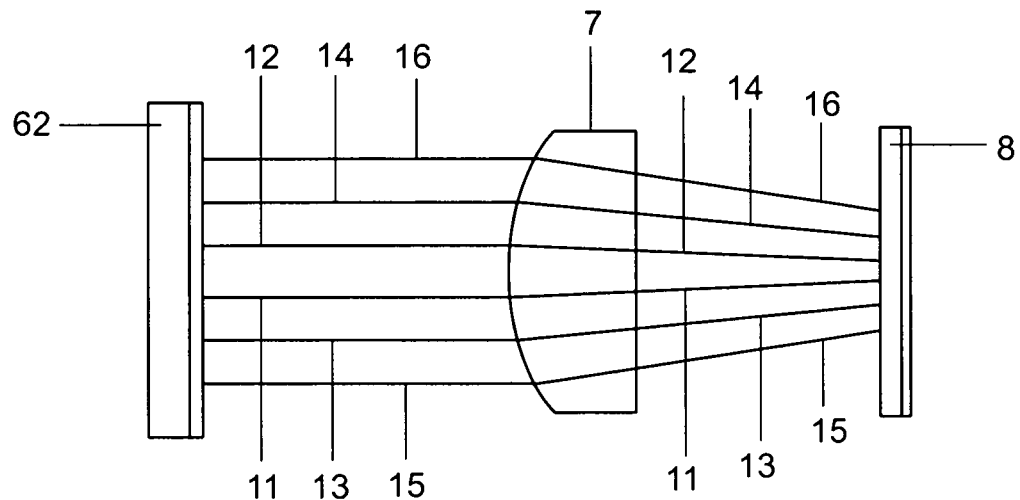
FIG. 4 shows a cross section of the second deflection mirror, the plano-convex cylindrical lens and the micromirror, which is able to be panned about an axis, of the illumination device imaged in FIG. 1 and FIG. 2 in schematic illustration.
Figure 5:
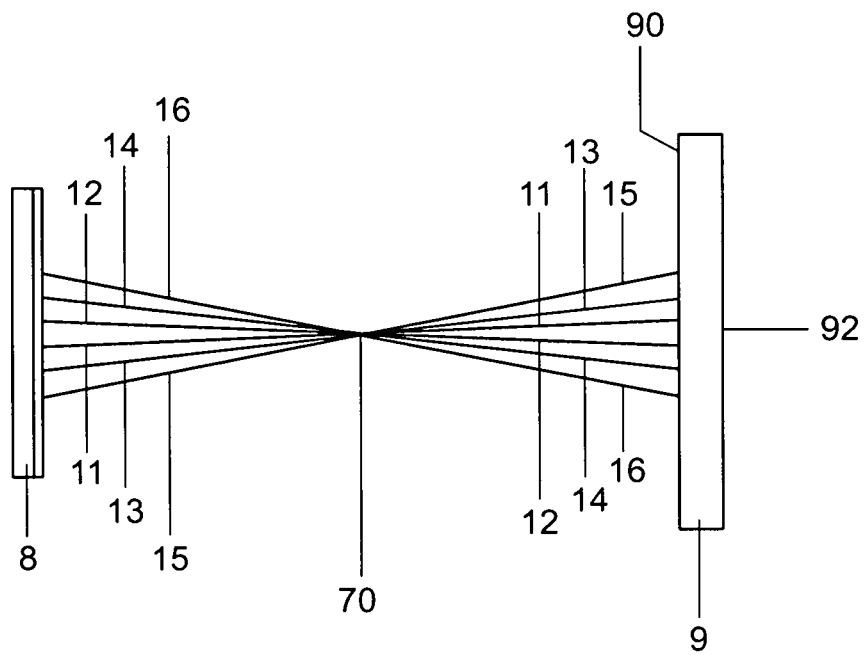
FIG. 5 shows a cross section of the micromirror, which is able to be panned about an axis, and the light wavelength conversion element of the illumination device illustrated in FIG. 1 and FIG. 2 in schematic illustration.

The illumination device 1 has a cube-shaped housing 2, a semiconductor laser device 30 having six laser diodes 31 to 36, three deflection prisms 37 to 39, six aspherical optical lenses 41 to 46, six plano-concave optical lenses 51 to 56, two deflection mirrors 61, 62, a plano-convex cylindrical lens 7, a micromirror 8 that is able to be panned about an axis 80, and a light wavelength conversion element 9. The components just mentioned of the illumination device 1 are all arranged inside the housing 2 or on a wall 21 to 24 or on the bottom of the housing 2. The semiconductor laser device 30, the deflection prisms 37 to 39 and the aspherical lenses 41 to 46 are also referred to as a beam combiner 3. FIG. 3 to FIG. 5 schematically illustrate the laser beam path between some components of the illumination device 1.

The housing 2 of the illumination device 1 consists of metal, may be aluminum, and has a bottom 20 and four side walls 21 to 24, and a cover, which is not illustrated in FIG. 1 and FIG. 2. The bottom 20 and the side walls 21 to 24 serve as carriers for the components of the illumination device 1. The external dimensions of the cube-shaped housing 2 are 100 mm×100 mm×50 mm.

The semiconductor laser device 30 has six laser diodes 31, 32, 33, 34, 35 and 36, which are identical in terms of type and during operation emit blue laser light each having a wavelength of 450 nm. The laser diodes 31 to 36 are arranged in two rows that extend parallel with respect to the bottom 20 and in three columns that extend perpendicular to the bottom 20. The laser diodes 31 to 36 are attached to a first side wall 21 of the housing 2 such that the laser beams 11 to 16 emitted by the laser diodes 31 to 36 are each aligned perpendicular to the bottom 20 and parallel with respect to the first side wall 21. FIG. 3 schematically illustrates the arrangement and alignment of the laser diodes 31 to 36. The laser diodes 31, 33, 35 are arranged in a first row that extends parallel to the bottom 20 of the housing above the bottom 20 and aligned such that the laser beams 11, 13, 15 emitted by them each extend perpendicular to the bottom 20 and are aligned with the housing cover (not illustrated), which is located opposite the bottom 20. The laser diodes 32, 34, 36 are arranged in a second row that extends parallel with respect to the bottom 20 of the housing and at a greater height above the bottom 20 than the first row. The laser diodes 32, 34, 36 are aligned such that the laser beams 12, 14, 16 they emit each extend perpendicular to the bottom 20 and are directed toward the bottom 20. The laser diodes 31, 32 and 33, 34 and also 35, 36 are fixed to the first side wall 21 of the housing 2 in each case one above the other.

The laser beams 11 to 16 emitted by the laser diodes 31 to 36 each have a strong elliptical profile, with the result that the laser beams 11 to 16 create a laser light spot or laser spot having an elliptical contour on a screen that is arranged in a plane perpendicular to the light propagation direction of said laser beams. In addition, the expansion or divergence of the laser beams 11 to 16 is in each case direction-dependent. The laser beams 11 to 16 each have the maximum divergence or expansion along their fast axis FA, and the laser beams 11 to 16 each have the smallest divergence or expansion along their slow axis SA. The fast axis and the slow axis are arranged perpendicular to one another and oriented in each case perpendicular to the light propagation direction of the laser beams. The expansion of the laser beams 11 to 16 along their fast axis FA is approximately four times as great as the expansion thereof along their slow axis SA. This varying expansion of the laser beams 11 to 16 along the slow axis SA and the fast axis FA has the result that the shape and size of the laser spots created by laser beams 11 to 16 on screens that are placed in planes perpendicular to the light propagation direction with different distances from the laser diodes 31 to 36 differ. For example, the divergence angle along the fast axis of the laser beams 11 to 16 is approximately 23°, and along their slow axis is only approximately 6°.

Figure 6:
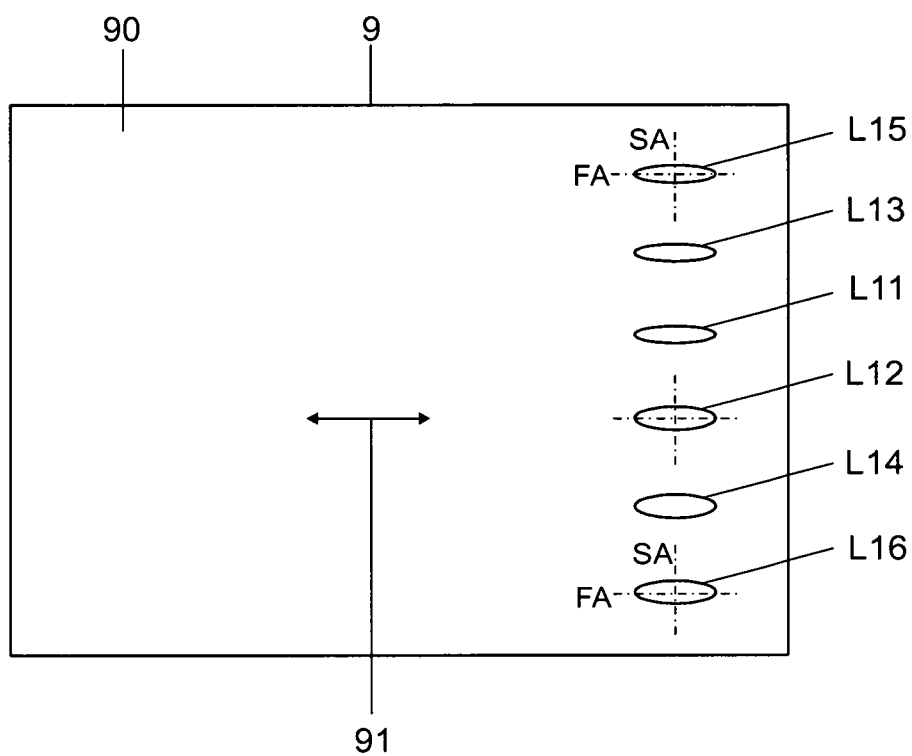
FIG. 6 shows a top view of the surface, which is illuminated with laser light, of the light wavelength conversion element of the illumination device illustrated in FIG. 1 and FIG. 2 in schematic illustration.

The laser spots created by the laser beams 11 to 16 on a screen, which is arranged perpendicular to their light propagation direction, therefore have an elliptical contour, wherein the semi-major axis of the elliptical contour is oriented in each case parallel with respect to the fast axis of the respective laser beam 11 to 16, and the semi-minor axis of the elliptical contour of the laser beam 11 to 16 is oriented in each case parallel with respect to the slow axis of the respective laser beam 11 to 16. In the illustration of FIG. 6, this is schematically illustrated by way of the laser spots L11 to L16.

FIG. 3 schematically illustrates the arrangement of the six laser diodes 31 to 36 of the semiconductor laser device 30 and of the deflection prisms 37 to 39 and of the aspherical lenses 41 to 46. The laser beams 11 to 16 generated by the laser diodes 31 to 36 are illustrated in FIG. 1 to FIG. 5 by way of lines 11 to 16 having arrows, which indicate the propagation directions of the laser beams 11 to 16. The fast axis FA of the laser beams 11 to 16 is oriented in FIG. 3 in each case perpendicular to the drawing plane, and their slow axis SA is in each case located in the drawing plane.

Each laser diode 31 to 36 has associated with it an aspherical optical lens 41 to 46 through which the laser beams 11 to 16 in each case pass immediately after they leave the respective laser diode 31 to 36. The focal lengths of the aspherical optical lenses 41 to 46 are chosen such that the laser beams 11 to 16 respectively produce a laser spot L11 to L16 on a surface 90 of the light wavelength conversion element 9, with the extents of these laser spots in the horizontal direction having a desired value of, for example, in each case 360 μm.

The first laser beam 11 and the second laser beam 12 are deflected each by an angle of 90° using two mirror surfaces of the first deflection prism 37, which is arranged between the first laser diode 31 and the second laser diode 32, such that both laser beams 11, 12 extend in each case parallel with respect to the bottom 20 of the housing 2 and in the same direction. Analogously, the third laser beam 13 and fourth laser beam 14 are deflected each by an angle of 90° by way of two mirror surfaces of the second deflection prism 38, which is arranged between the third laser diode 33 and the fourth laser diode 34, such that both laser beams 13, 14 extend in each case parallel with respect to the bottom 20 of the housing 2 and in the same direction. The fifth laser beam 15 and sixth laser beam 16 are also deflected each by an angle of 90° by way of two mirror surfaces of the third deflection prism 39, which is arranged between the fifth laser diode 35 and sixth laser diode 36, such that both laser beams 15, 16 each extend parallel with respect to the bottom 20 of the housing 2 and in the same direction. Overall, all six laser beams 11 to 16 thus extend parallel with respect to the bottom 20 and in the same direction after they leave the beam combiner 3.

Arranged at the exit of the beam combiner 3 are the six plano-concave cylindrical lenses 51 to 56, which serve for expanding the laser beams 11 to 16 along their slow axis SA and thus counteract focusing of the laser beams 11 to 16, which is caused by the aspherical optical lenses 41 to 46, along their slow axis SA. Each of the laser beams 11 to 16 passes through one of the plano-concave cylindrical lenses 51 to 56, which are arranged one above the other in the manner of a stack. The plano-concave cylindrical lenses 51 to 56 are oriented such that their concave curvature extends in each case in the direction of or along the slow axis SA of the laser beams. As a result, the laser beams 11 to 16 are expanded in each case only along their slow axis SA. The plano-concave cylindrical lenses 51 to 56 do not increase the divergence of the laser beams 11 to 16 along the fast axis FA. The focusing of the laser beams 11 to 16, which is achieved by way of the aspherical optical lenses 41 to 46, along their fast axis FA is thus maintained. The three plano-concave cylindrical lenses 51, 53, 55 have different focal lengths than the other three plano-concave cylindrical lenses 52, 54, 56, with the result that the laser beams 11, 13, 15 experience less expansion along their slow axis SA than the laser beams 12, 14, 16. The focal lengths of the three plano-concave cylindrical lenses 51, 53, 55 are matched to the focal length of the plano-convex cylindrical lens 7 and to the focal lengths of the aspherical optical lenses 41, 43, 45 such that the laser spots L11, L13, L15, which are created by the laser beams 11, 13, 15 on the surface 90 of the light wavelength conversion element 9, have each a desired extent in the vertical direction with a value of, for example 444 μm.

Analogously, the focal lengths of the three plano-concave cylindrical lenses 52, 54, 56 are matched to the focal length of the plano-convex cylindrical lens 7 and to the focal lengths of the aspherical optical lenses 42, 44, 46 such that the laser spots L12, L14, L16, which are created by the laser beams 12, 14, 16 on the surface 90 of the light wavelength conversion element 9, have, in the vertical direction, a desired extent with a value of, for example, 756 μm.

After the laser beams 11 to 16 have passed through the plano-concave cylindrical lenses 51 to 56, they are incident on the first deflection mirror 61, which is arranged in the corner that is formed by the first side wall 21 and the second side wall 22. The laser beams 11 to 16 are deflected each by an angle of 90° by way of the first deflection mirror 61, with the result that they extend at different heights above the bottom 20 and in each case parallel with respect to the second side wall 22 and the bottom 20. The fast axis FA of the laser beams 11 to 16 is oriented in each case parallel with respect to the bottom 20, and the slow axis SA of the laser beams 11 to 16 is arranged in each case perpendicular to the bottom 20.

The laser beams 11 to 16 are deflected by an angle of 45° by way of the second deflection mirror 62, which is arranged in the corner that is formed by the second side wall 22 and the third side wall 23 of the housing 2, with the result that they are incident on the micromirror 8 which is arranged centrally in the housing 2 after they have passed through the plano-convex cylindrical lens 7. The two deflection mirrors 61, 62 permit a compact arrangement of the components of the illumination device 1 in the housing 2.

The micromirror 8 is configured in the form of a MEMS mirror, with the abbreviation MEMS standing for micro-electro-mechanical system. The dimensions of the mirror surface of the micromirror 8 are 5 mm×1.5 mm. The micromirror 8 is fixed in a holder 81 on a mount 82 on the bottom 20 of the housing 2, with the result that it is able to be panned about a pan axis 80 which extends vertically with respect to the bottom 20. The laser beams 11 to 16 are directed onto the surface 90 of the light wavelength conversion element 9 by way of the micromirror 8. A surface section of the surface 90 of the light wavelength conversion element 9 is row-scanned with the laser beams 11 to 16 by way of a panning movement of the micromirror 8 about its pan axis 80. For scanning, the micromirror 8 oscillates about its pivot axis 80 at a frequency of, for example, 133 Hz. The surface section of the surface 90 of the light wavelength conversion element 9, which is able to be illuminated with the laser beams 11 to 16, is delimited by the panning range 17 of the micromirror 8. FIG. 1 schematically illustrates the maximum panning range by way of dashed lines 17. The micromirror 8 is electromagnetically driven. As a result, instead of an oscillation movement, the micromirror 8 can also be operated statically in order to keep it fixed, for example, in a desired orientation, or the speed of the panning movement can be changed or the panning movement can be performed over only a portion of the maximum panning range. The maximum panning range can be smaller or greater than the lateral dimensions of the light wavelength conversion element.

FIG. 6 schematically illustrates the arrangement of the laser spots L11 to L16, produced by the laser beams 11 to 16 on the surface 90 of the light wavelength conversion element, corresponding to a snapshot during the panning movement of the micromirror 8. The laser spots L11 to L16 are arranged vertically one above the other on the surface 90 of the light wavelength conversion element 9 and are simultaneously guided over the surface 90 by way of the panning movement of the micromirror 8 about its panning axis 80 along the scanning directions 91, which are symbolized by way of a double headed arrow. The distance between the laser spots L11 to L16 on the surface 90 of the light wavelength conversion element 9 is set to a desired value by way of the plano-convex cylindrical lens 7. By way of example, the focal length of the plano-convex cylindrical lens 7 is chosen such that the distance between two adjacent laser spots on the surface 90 of the light wavelength conversion element 9 is in each case 600 μm in the case of the laser spots L11, L13 and L15, and is in each case 900 μm in the case of the laser spots L12, L14 and L16.

The fast axis FA of the laser beams 11 to 16, upon their incidence on the surface 90 of the light wavelength conversion element 9, in each case extends parallel with respect to the scanning directions 91, and their slow axis in each case extends perpendicular to the scanning directions 91. FIG. 6 illustrates this, for the sake of clarity, only for the laser spots L15, L16 which are created by the laser beams 15, 16. The laser spots L11, L13, L15 have in each case a maximum dimension of 444 μm in the direction of the slow axis SA, and in each case a maximum dimension of 360 μm in the direction of the fast axis FA. The laser spots L12, L14, L16 have in each case a maximum dimension of 756 μm in the direction of the slow axis SA, and in each case a maximum dimension of 360 μm in the direction of the fast axis FA. The contour of the laser spots L11 to L16 is in each case elliptical, wherein the semi-major axis of the elliptical contour extends in each case parallel with respect to the slow axis SA and the semi-minor axis of the elliptical contour extends in each case parallel with respect to the fast axis FA and parallel with respect to the scanning directions 91 owing to the focusing or expanding effect of the optical components 41 to 46, 51 to 56 and 7 on the laser beams 11 to 16. In the schematic illustration in FIG. 6, the effect of the previously mentioned optical components 41-46, 51-56, 7 on the shape of the laser spots L11 to L16 is not taken into consideration. In the illustration of FIG. 6, the semi-major axis of the elliptical contour of the laser spots L11 to L16 is therefore oriented in each case parallel with respect to the fast axis and the semi-minor axis of the elliptical contour of the laser spots L11 to L16 is in each case oriented parallel with respect to the slow axis.

FIG. 4 shows a cross section with a section plane perpendicular to the bottom 20 through the second deflection mirror 62, the plano-convex cylindrical lens 7 and the micromirror 8. FIG. 4 schematically illustrates the profile of the laser beams 11 to 16 between the second deflection mirror 62 and the micromirror 8. After the deflection mirror 62, all laser beams 11 to 16 are incident on the plano-convex cylindrical lens 7. The slow axis SA of the laser beams 11 to 16 on the surface 90 of the light wavelength conversion element 9 is adjusted by way of the plano-convex cylindrical lens 7 such that the vertical distance between the laser spots L11 to L16 is set to a desired value. The focal length of the plano-convex cylindrical lens 7 is therefore appropriately chosen. Its focus 70 is in the region between the micromirror 8 and the light wavelength conversion element 9 (FIG. 5). The convex curvature of the plano-convex cylindrical lens 7 is oriented parallel with respect to the slow axis SA of the laser beams 11 to 16. The plano-convex cylindrical lens 7 therefore unfolds its focusing effect only along the slow axis SA of the laser beams 11 to 16. In FIG. 4, the fast axis FA of the laser beams 11 to 16 is in each case oriented perpendicular to the drawing plane, and the slow axis is oriented in each case in the drawing plane, perpendicular to the light propagation direction.

FIG. 5 schematically illustrates a cross section with a section plane perpendicular to the bottom 20 through the micromirror 8 and the light wavelength conversion element 9. FIG. 5 schematically illustrates the profile of the laser beams 11 to 16 between the micromirror 8 and the surface 90 of the light wavelength conversion element 9. The arrangement of the laser beams 11 to 16 is switched around due to refraction of the laser beams 11 to 16 at the plano-convex cylindrical lens 7 and the arrangement of their focal line or their line-shaped focus 70 upstream of the surface 90 of the light wavelength conversion element 9, with the result that the laser spot L16, created by the laser beam 16, is the lowermost laser spot, and the laser spot L15, created by the laser beam 15, is the uppermost laser spot on the surface 90 of the light wavelength conversion element 9.

The light wavelength conversion element 9 is arranged in a window 230 in the third side wall 23 of the housing 2 of the illumination device 1. The light wavelength conversion element 9 includes or essentially consists of a ceramic phosphor, which is arranged on a transparent substrate that is configured, for example, in the form of a rectangular sapphire plate. The phosphor used is cerium-doped yttrium aluminum garnet (YAG:Ce). The dimension of the window area of the window 230 and the light wavelength conversion element 9 that is arranged therein is only a few square millimeters, for example 20 mm$^2$.

The surface 90 of the light wavelength conversion element 9 is arranged inside the housing 2, and its opposite surface 92 is arranged outside the housing 2. The blue laser light, which is generated by the laser beams 11 to 16 and is incident on the surface 90 in the laser spots L11 to L16, passes through the light wavelength conversion element 9, and is partially converted in the process, by way of the phosphor, into light of a different wavelength with an intensity maximum in the wavelength range of 560 nm to 590 nm, with the result that the surface 92 of the light wavelength conversion element 9 emits white light which is a mixture of non-wavelength converted blue laser light and light that has been wavelength-converted by the light wavelength conversion element 9.

Overall, the light wavelength conversion element 9, which is arranged in the window 230, or its surface 92, located on the outside of the housing 2, can therefore be regarded as a light source which emits white light with high intensity and luminance.

For application in a motor vehicle headlight, the surface 92 of the light wavelength conversion element 9 can be projected onto the road in front of the vehicle using a secondary optical unit, for example using a projection optical unit, in order to produce a desired light distribution, for example for low beam or high beam. The desired light distribution is generated by way of the laser spots L11 to L16 on the surface 90 of the light wavelength conversion element 9. The laser spots L11 to L16 are guided over a surface section of the surface 90 of the light wavelength conversion element 9 by way of the panning movement of the micromirror 8. During the panning movement of the micromirror 8, for example individual laser diodes 31 to 36 can be temporarily switched off or dimmed or operated with increased current, such that individual laser spots L11 to L16 are changed, and/or modulated, temporarily in terms of their intensity, or the panning range of the micromirror 8 can be limited in order to change the light distribution.

The illumination device 1 is a part of a motor vehicle headlight. The two mutually opposite side walls 22, 24 of the housing 2 are provided on their outside in each case with an attachment apparatus 220, 240, which permits mounting of the illumination device 1 in a motor vehicle headlight.

The embodiments are not limited to the embodiments that are explained in more detail above.

By way of example, it is possible instead of six laser diodes 31 to 36 to use a smaller or greater number of laser diodes. In addition, the optical components 41 to 46, 51 to 56 and 7 can be configured such that the dimensions of the laser spots L11 to L16 in the direction of the slow axis and fast axis have different values than in the above-explained embodiments. In various embodiments, some or all laser spots L11 to L16 can also be arranged on the surface 90 of the light wavelength conversion element 9 in overlapping fashion or with different distances.

The illumination device 1 can furthermore include a plurality of light wavelength conversion elements 9, the surfaces of which are scanned with laser light by way of the micromirror 8. Furthermore, a plurality of micromirrors 8 can be provided in order to scan a surface section of the surface of one or more light wavelength conversion elements 9 with laser light.

The light wavelength conversion element 9 may furthermore be configured in the form of a phosphor wheel which is mounted so as to be pivotable about its axis. By way of a rotation of the phosphor wheel, the illumination duration of the regions coated with phosphor is reduced, and thus heat dissipation is improved. The phosphor wheel can additionally have segments having different phosphor coating in order to generate, for example, white light having a different color temperature.

In a further configuration (without illustration), the semiconductor laser arrangement and the beam guidance and beam shaping arrangement can be arranged in duplicate and symmetrically with respect to the first irradiation arrangement and thus permit the additional semiconductor lasers to irradiate the micromirror or the light wavelength conversion element from the opposite side. In that case, the light generation output of the illumination device can be increased due to the double irradiation of the light wavelength conversion element that is then possible. Here, the second irradiation arrangement does not need to scan the entire area of the light wavelength conversion element, but can also do this only in section-wise fashion. As a result, for example the light generation in the center region of the light wavelength conversion element can be increased. However, the increase of the light generation due to the doubled irradiation guidance can be applied to all regions of the light wavelength conversion element. The second irradiation arrangement can be offset in height with respect to the first irradiation arrangement. This permits the light wavelength conversion element to be scanned with irradiation paths that are closer together, which results in an increased resolution of the light distributions to be generated (high beam, low beam etc.).

The wavelength of the semiconductor lasers of the second irradiation arrangement can also differ from that of the first irradiation arrangement.

It is also possible, instead of a MEMS mirror, to use a pannable LCoS (liquid crystal on silicon) mirror arrangement.

LIST OF REFERENCE SIGNS 1 illumination device
11 to 16 laser beams
2 housing
20 bottom
21 first side wall
22 second side wall
23 third side wall
24 fourth side wall
220, 240 attachment means
3 semiconductor laser device
31 to 36 laser diodes
37 to 39 deflection prisms
41 to 46 aspherical optical lenses
51 to 56 plano-concave cylindrical lenses
61, 62 deflection mirror
7 plano-convex cylindrical lens
70 focal line of the plano-convex cylindrical lens 7
8 pannable micromirror
80 pan axis of the micromirror
81 holder of the micromirror
82 mount of the micromirror
9 light wavelength conversion element
90 internally located surface of the light wavelength conversion element
92 externally located surface of the light wavelength conversion element
91 scanning directions
L11 to L16 laser spots
L1 to L3 laser spots
E1 to E3 fictitious planes
FA fast axis of the laser beams
SA slow axis of the laser beams While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. An illumination apparatus, comprising:
   a semiconductor laser device configured to generate a plurality of laser beams;
   at least one light wavelength conversion element configured to convert at least a portion of the light of the laser beams into light having a different wavelength;
   an optical unit configured to direct the laser beams onto a surface of the at least one light wavelength conversion element;
   wherein the optical unit comprises at least one mirror element that is able to be panned about at least one axis and is configured to guide the laser beams over at least one surface section of the surface of the at least one light wavelength conversion element; and
   wherein the optical unit comprises a structure configured to adjust a divergence or expansion of the laser beams along at least one of a slow axis or a fast axis of the laser beams on the surface section of the surface of the at least one light wavelength conversion element.

2. The illumination device of claim 1,
   wherein the structure comprises at least one first cylindrical lens for focusing the laser beams along the slow axis of the laser beams.

3. The illumination device of claim 2,
wherein the at least one first cylindrical lens is configured in the form of a plano-convex cylindrical lens, a convex curvature of which extends in a direction of the slow axis of the laser beams.

4. The illumination device of claim 1,
wherein the optical unit and the semiconductor laser device are configured such that the laser beams are each guided parallel with respect to a scanning direction over the surface section of the surface of the at least one light wavelength conversion element.

5. The illumination device of claim 4,
wherein the optical unit and the semiconductor laser device are configured such that the slow axis of the laser beams is arranged on the surface section of the surface of the at least one light wavelength conversion element in each case perpendicular to the scanning direction.

6. The illumination device of claim 2,
wherein the structure comprises at least one aspherical optical element for focusing the laser beams along the fast axis of the laser beams.

7. The illumination device of claim 6,
wherein the at least one aspherical optical element is arranged in the beam path of the laser beams upstream of the at least one first cylindrical lens.

8. The illumination device of claim 1,
wherein the structure comprises at least one second cylindrical lens, which is arranged in the beam path of at least one laser beam for the purpose of expanding the laser beams along the slow axis of at least one laser beam.

9. The illumination device of claim 8,
wherein the at least one second cylindrical lens is configured in the form of a plano-concave cylindrical lens.

10. The illumination device of claim 9,
wherein a concave curvature of the at least one second cylindrical lens extends in the direction of the slow axis of the laser beam.

11. The illumination device of claim 8,
wherein the structure comprises, for the purpose of expanding a plurality of laser beams along their slow axis, a plurality of second cylindrical lenses having different optical properties.

12. The illumination device of claim 8,
wherein the illumination device is configured such that the propagation direction and the slow axis and the fast axis of the laser beams, which are emitted by the semiconductor laser device, are oriented in each case parallel with respect to one another.

13. The illumination device of claim 1,
wherein the semiconductor laser device has a plurality of laser diodes, which are each configured to generate blue laser light during operation; and
wherein the at least one light wavelength conversion element is configured to convert a proportion of the blue laser light into light of a different wavelength, with the result that the at least one light wavelength conversion element emits white light which is a mixture of non-wavelength-converted blue laser light and light that has been wavelength-converted at at least one light wavelength conversion element.

14. The illumination device of claim 1,
wherein the illumination device is configured as a part of a motor vehicle headlight or as a motor vehicle headlight.

15. An illumination apparatus, comprising:
a semiconductor laser device configured to generate a plurality of laser beams;
a light wavelength converter configured to convert at least a portion of the light of the laser beams into light having a different wavelength;
an optical unit configured to direct the laser beams onto a surface of the light wavelength converter;
wherein the optical unit comprises at least one mirror pivotably mounted around an axis; and
wherein the optical unit comprises a structure to adjust a divergence or expansion of the laser beams along a slow axis or a fast axis of the laser beams on a portion of the surface of the at least one light wavelength converter.

* * * * *